United States Patent [19]

Catalano et al.

[11] 4,342,879
[45] Aug. 3, 1982

[54] THIN FILM PHOTOVOLTAIC DEVICE

[75] Inventors: Anthony W. Catalano; Manjul Bhushan, both of Wilmington, Del.

[73] Assignee: The University of Delaware, Newark, Del.

[21] Appl. No.: 200,447

[22] Filed: Oct. 24, 1980

[51] Int. Cl.$^3$ .................................... H01L 31/06
[52] U.S. Cl. ........................ 136/265; 136/260; 136/256; 136/258; 357/30; 357/67; 357/71; 148/177; 148/188
[58] Field of Search ............... 136/260, 256, 258, 265; 357/30, 65, 67, 59, 61

[56] References Cited

U.S. PATENT DOCUMENTS

| 2,861,909 | 11/1958 | Ellis | 148/33 |
| 3,679,949 | 7/1972 | Uekusa et al. | 357/30 |
| 4,064,521 | 12/1977 | Carlson | 357/2 |

FOREIGN PATENT DOCUMENTS 9401 4/1980 European Pat. Off. ............ 136/265

OTHER PUBLICATIONS

C. Feldman et al., "Vacuum Deposited Polycrystalline Silicon Solar Cells for Terrestrial Use, "*Conf. Record, 14th IEEE Photovoltaic Specialists Conf.* (1980).

C. Feldman et al., "Vacuum Deposited Polycrystalline Silicon Solar Cells, Conf. Record, 12th IEEE Photovoltaic Specialists Conf. (1976), pp. 100–105.

*Primary Examiner*—Aaron Weisstuch
*Attorney, Agent, or Firm*—Connolly and Hutz

[57] ABSTRACT

A thin film photovoltaic solar cell which utilizes a zinc phosphide semiconductor is of the homojunction type comprising an n-type conductivity region forming an electrical junction with a p-type region, both regions consisting essentially of the same semiconductor material. The n-type region is formed by treating zinc phosphide with an extrinsic dopant such as magnesium. The semiconductor is formed on a multilayer substrate which acts as an opaque contact. Various transparent contacts may be used, including a thin metal film of the same chemical composition as the n-type dopant or conductive oxides or metal grids.

8 Claims, 5 Drawing Figures

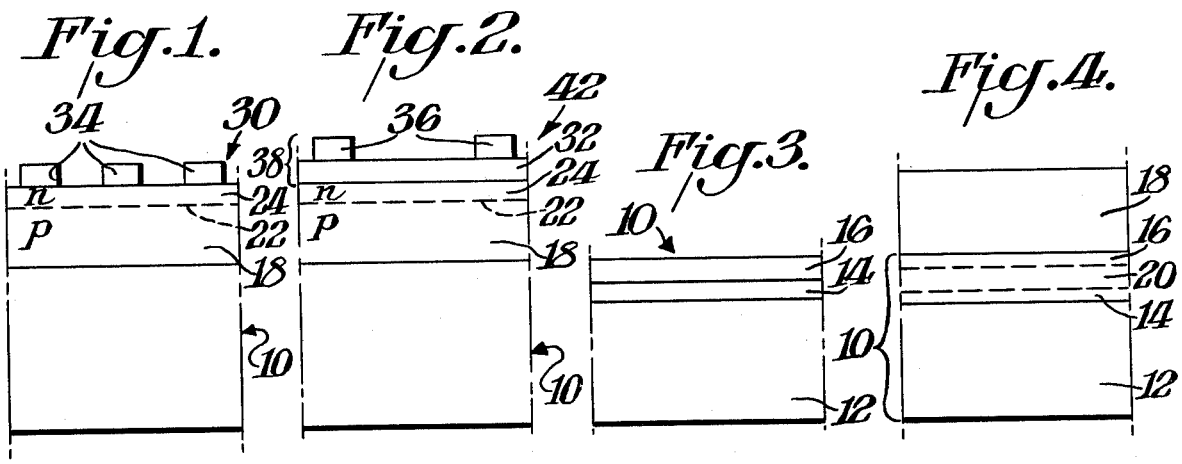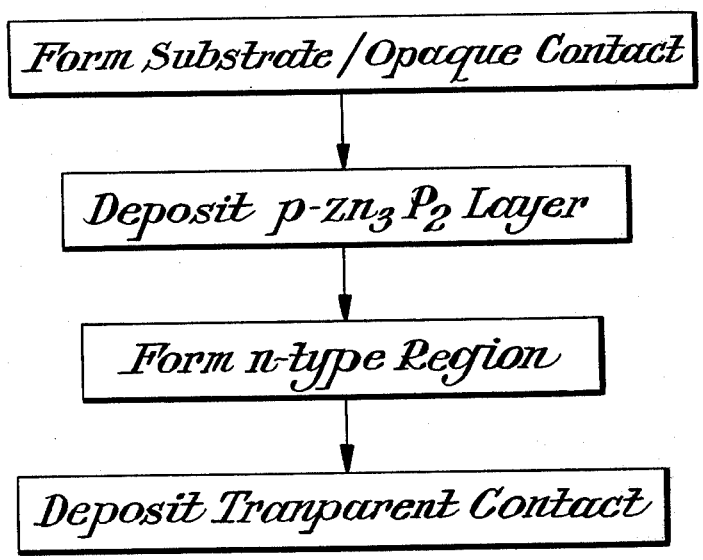

THIN FILM PHOTOVOLTAIC DEVICE

The Government has rights in this invention pursuant to subcontract number XR-9-8062-1 awarded by the Solar Energy Research Institute under U.S. Department of Energy Contract No. EG-77-C-01-4042.

BACKGROUND OF INVENTION

This invention is particularly directed to improvements in photovoltaic devices and the like and particularly such devices which include at least one semiconductor layer which is a thin polycrystalline film of suitable large grain size. One such semiconductor material is zinc phosphide [$Zn_3P_2$].

Zinc phosphide is an important semiconductor for photovoltaic solar cells. See, for example, a report by applicant et al, which was published in the *Proceedings of the Fourteenth IEEE Photovoltaic Specialists Conference* pp. 641-646 [1980] and references cited therein. It possesses a steep optical absorption edge near 1.5 eV where the maximum performance of terrestrially based cells is expected, has a sufficiently long [$\sim 10$ $\mu$m] minority carrier diffusion length to permit high current collection efficiency and is comprised of elements which are abundant, thus permitting widespread use. To date, conversion efficiencies as high as 6.08% [total area, 100 mW/cm$^2$ ELH simulation] have been reported for metal-semiconductor junctions. The efficiency of these cells is limited by a maximum open circuit voltage of 0.5 volts developed by the metal-semiconductor junction. The open circuit voltage of such cells is limited by the $\sim 0.8$ eV barrier height observed for several metals, regardless of work function. Improved open circuit voltage is expected from p/n homojunction cells wherein the junction is formed by contiguous regions of the same semiconductor having opposite conductivity types respectively. The particular advantage of homojunction cells results from minimization of discontinuity in the energy band structure while the gross composition remains the same. Heretofore, development of a $Zn_3P_2$ homojunction cell has been prevented by the fact that only p-type conductivity had been observed for $Zn_3P_2$ and attempts to prepare the n-type semiconductor by incorporating In, Ga, Sn or Al as substitutional dopants have yielded only high resistivity p-type material. The electrical conductivity of the undoped semiconductor is apparently controlled by native interstitial defects which suggested that a self-compensation mechanism may have prevented preparing the n-type semiconductor by such methods.

A further disadvantage with such semiconductor materials as zinc phosphide is in the difficulties encountered for selecting a proper substrate which meets the necessary criteria while being compatible with high temperature growth.

SUMMARY OF INVENTION

The object of this invention is a high efficiency, low cost thin film solar cell, the improvement being a p/n homojunction cell comprised of zinc phosphide.

A further object of this invention is a means for doping zinc phosphide in order to prepare the thin film homojunction.

A still further object of this invention is to provide such a device which incorporates a substrate which is substantially unaffected by the high temperature growth conditions.

In accordance with one aspect of this invention, the semiconductor such as zinc phosphide is treated with a doping agent such as magnesium so that an n-type conductivity region results to thereby form a homojunction.

In accordance with another aspect of this invention, a multilayer substrate is used wherein one of the layers of the substrate acts as a support for the remaining layers of the device and has an expansion coefficient equal to or slightly larger than the expansion coefficient of the semiconductor layer. The substrate layers may also include a metal layer of low resistivity and high conductivity and may also include a layer adjacent to the semiconductor layer which functions as both barrier and as means for adhering to its adjacent substrate layer.

THE DRAWINGS

FIG. 1 is a cross-sectional view in elevation (with the cross hatching omitted for clarity) of a thin film photovoltaic solar cell in accordance with this invention wherein the transparent contact consists of a metal in the form of a grid or series of parallel stripes;

FIG. 2 is a cross-sectional view in elevation (with the cross hatching omitted for clarity) of a thin film photovoltaic solar cell in accordance with another aspect of this invention wherein the transparent contact is comprised of two components;

FIG. 3 is a cross-sectional view in elevation (with the cross hatching omitted for clarity) showing a substrate in accordance with this invention;

FIG. 4 is a cross-sectional view similar to FIG. 1 showing the substrate of FIG. 3 with the semiconductor layer grown thereon; and FIG. 5 is a schematic flow diagram showing the steps in the fabrication of a solar cell in accordance with this invention.

DETAILED DESCRIPTION

This invention is related to an improved thin film photovoltaic solar cell which includes an opaque contact, a transparent contact and at least one semiconductor layer formed therebetween. The semiconductor layer consists of a p-type region and an n-type region forming a homojunction. Such semiconductor material is from the class of isostructural compounds comprised of elements from Groups IIB and VA of the Periodic Table, for example, zinc phosphide [$Zn_3P_2$], zinc arsenside [$Zn_3As_2$], cadmium phosphide [$Cd_3P_2$], cadmium arsenside [$Cd_3As_2$] and alloys thereof. Such semiconductor layers are formed by high temperature vapor deposition methods. This invention further relates to a suitable substrate and techniques for the fabrication of such thin film photovoltaic solar cells. FIGS. 1-2 relate to the homojunction solar cell. FIGS. 3-4 relate to the substrate. FIG. 5 relates to the method of fabricating the devices of FIGS. 1-2.

FIGS. 1-2 relate to the particularly advantageous aspect of the invention which is a homojunction using a semiconductor of a material such as zinc phosphide. Only p-type conductivity has been previously reported for $Zn_3P_2$ at room temperature. Past attempts to substitutionally dope $Zn_3P_2$ n-type with In, Ga, Sn, S and Al have yielded only high resistivity p-type material. The lack of n-type conductivity in $Zn_3P_2$ has prevented the preparation of homojunction devices, imposing a significant limitation on the usefulness of $Zn_3P_2$ for solid state devices.

A method of extrinsic n-type doping has been discovered which permits high efficiency homojunction solar cells to be prepared and would also allow other p/n junction containing devices such as transistors to be fabricated using $Zn_3P_2$ for the first time.

Surprisingly, n-type conductivity in $Zn_3P_2$ was discovered by heating $Zn_3P_2$ in contact with magnesium. Magnesium is incorporated in the $Zn_3P_2$ in such a way as to result in a conversion from the p-type conductivity usually found to n-type conductivity (i.e., function in the manner of an extrinsic dopant). When zinc phosphide/magnesium devices which were presumed to be Schottky diodes were heated in air at 100° C., there resulted a substantial improvement in the diode characteristic and an increase in open circuit voltage. The saturation current, $J_o$ of evaporated magnesium contacts is on the order of $10^{-7}$ A/cm$^2$, in agreement with the 0.8 eV barrier height determined by internal photoelectrical emission [IPE]. Heating magnesium contacts for twenty-four hours, however, results in a factor of $\sim 10^2$ decrease in $J_o$. $J_o$ exhibits the exponential dependence on inverse temperature characteristic of any energy activated process. As deposited, magnesium diodes show an activation energy close to 0.3 eV which, upon heating, increases to about 0.8 eV consistent with the increase of diffusion voltage as expected for a homojunction device.

In the course of these experiments $Mg/Zn_3P_2$ diodes were prepared on chemically polished, silver doped [$N_p \sim 10^{15}$ cm$^{-3}$], wafers approximately 0.05 cm thick. Devices for electron beam induced current [EBIC] measurements were prepared by vacuum evaporation of Mg onto the semiconductor to produce an opaque, 2000 Å thick contact. The transparent metal film [TMF] devices used for spectral response measurements were prepared on wafers cut from the same boule. The transparent magnesium films were deposited by d.c. sputtering the metal in an argon ambient. The metal films were less than 100 Å thick. Vacuum deposited $Ta_2O_5$ served as an antireflection coating and encapsulant. The devices were heated in air at $100\pm2°$ C. for time intervals totaling a maximum of twenty-four hours. Comparison of the dark current-voltage characteristics of the opaque and transparent metal film devices showed similar changes in $J_o$ and diode factor with heat treatment.

EBIC measurements were made of cross-sections through the junction. The measurements were made at accelerating voltages between 20–30 keV by scanning the beam perpendicular to the plane of the junction. The unheated devices showed an immediate fall-off in the beam induced current away from the magnesium contact. The current followed the expected exponential dependence with distance. The electron diffusion length $L_n$, was calculated according to the expression I $\alpha$ exp-x/$L_n$ where I is the beam induced current and x is the distance from the junction. Values of $L_n$ from 1–5 $\mu$m were found at various locations in the sample; however, a survey indicated the larger value was predominant. An average value of 4.4 $\mu$m was found. Heated samples showed the development of a maximum in the EBIC current located some distance from the original magnesium contact indicating movement of the junction away from the top surface of the device. This distance increased at longer heating times and the data indicated the junction was located 6 $\mu$m away from the magnesium contact after heating for twenty-four hours.

The formation of the n-type layer adjacent to the magnesium contact may be the result of magnesium doping of the $Zn_3P_2$. Since magnesium is isoelectronic with zinc, substitutional doping is unlikely to be responsible; however, the observed electrical activity as well as the rapid movement at relatively low temperature indicate diffusion via an interstitial mechanism may be responsible. Magnesium may be incorporated in the $Zn_3P_2$ as either an alloy or at very low concentrations as a substitutional or interstitial dopant. Other elements expected to be suitable as dopants to give n-type conductivity are based on similarities in valence, ionic size, chemical reactivity and the formation of phosphides of similar structure. Some of these are the elements of Group IA and IIA such Ca, Be, Zn, Li, Na and K. Thus, within the broad concepts of this invention it is expected that any univalent or multivalent cation interstitial dopant can be used for n-type conductivity doping of any of the class of IIB-VA semiconductors.

A photovoltaic cell 30 in accordance with this invention is shown in FIG. 1. The p-type semiconductor layer 18 is formed on substrate 10. Layer 24 is the n-type region which in contact with layer 18 forms electrical homojunction 22. Transparent contact 34 is a metallization pattern in the form of a grid or series of parallel stripes.

Referring to FIG. 1, substrate 10 may be an ironsilicon alloy sheet containing approximately three percent silicon. Alternatively, the substrate may be a multilayer structure which is described in greater detail hereinafter with respect to FIGS. 3-4. Layer 18 is polycrystalline p-type $Zn_3P_2$, 5–500 $\mu$m thick, preferably 10 $\mu$m thick. Layer 18 has a resistivity 1–100 $\Omega$-cm, preferably 20 $\Omega$-cm. Layer 24 is polycrystalline n-type $Zn_3P_2$, 0.1–1 $\mu$m thick, preferably 0.5 $\mu$m.

Transparent contact 34 is formed from metals such as aluminum, cadmium, magnesium, nickel, titanium or zinc. Preferably, the metal is aluminum or magnesium. The dimensions, i.e. width, height and spacing, of the grid may be determined to best advantage by applying the design criteria set forth by N. C. Wyeth in *Solid State Electronics*, volume 20, p. 629 [1977].

FIG. 2 illustrates a modified solar cell 42 in accordance with this invention. Opaque contact 1 substrate 10, p-type region 18, n-type region 24 and homojunction 22 are essentially the same as described for FIG. 1. Transparent contact 38, however, is comprised of two elements, window layer 32 and metallization 36. Window layer 32 is a transparent conductor which is either a thin metal film or an oxide semiconductor. When window layer 32 is a thin metal film, the metal is the same element as the n-type dopant used to form layer 24. In accordance with this invention, the transparent metal film of layer 32 is preferably magnesium, 100 Å thick. Alternatively when window layer 32 is a semiconducting oxide, zinc oxide, tin oxide or indium-tin-oxide may be used.

Transparent contact metallization 36 may be a grid or series of parallel stripes. The metal may be aluminum, cadmium, magnesium, nickel, titanium or zinc. The exact dimensions and geometrical disposition of the metallization may be determined in accordance with the methods set forth in the aforementioned publication by Wyeth. However, a particular feature of the cell illustrated in FIG. 2 is that the spacing and width of the metallization pattern 36 may, in general, be greater than it would be absent the window 32. Such increased dimensions make possible the use of lower cost manufacturing techniques without sacrificing energy conversion efficiency of the cell.

Where the invention is used to produce homojunction solar cells, these devices result in a significant increase in the open circuit voltage of the solar cell and indicate conversion efficiencies in excess of 18% should be possible.

The formation of semiconductor layers in accordance with this invention is carried out by growth from the vapor on to a heated substrate. In general, the growth of thin polycrystalline films of a suitable large grain size requires high temperatures to provide the necessary surface atom mobility. Unfortunately, if thin films are to be prepared by vapor transport, the components of the vapor may react with the substrate, giving rise to unwanted compounds, doping, etc. Some of the criteria which a substrate must meet for high temperature growth are: it must have a thermal coefficient of expansion close to that of the semiconductor[s] to be deposited; it must be nonreactive; it must not dope the semiconductor; it must be adherent; it must make low resistance ohmic contact to the semiconductor; it must have a low sheet resistance; and it must allow suitable nucleation and growth of the thin film. Unfortunately, the above criteria are seldom met by a single substance.

$Zn_3P_2$ has a high [$\sim 14 \times 10^{-6}$ C$^{\circ -1}$] thermal expansion coefficient which makes substrates of most refractory metals and semiconductors with low expansion [$< 6 \cdot 10^{-6}$ C$^{\circ -1}$] coefficient unsuitable for high temperature film growth. The thermal expansion coefficients of many of the more common metals [Al, Cu, Fe] are comparable to $Zn_3P_2$ and would prove to be ideal substrates provided their reaction with phosphorus vapors and diffusion into the semiconductor could be prevented.

The aspect of the invention of FIGS. 3-4 thus relates to providing a suitable back contact which would meet the following requirements: (1) make ohmic contact to $Zn_3P_2$, (2) be unreactive in Zn and $P_4$ vapor at the 500°-600° C. deposition temperature, and (3) be mechanically stable. Carbon meets the first two requirements and uniform films with 5-10 μm grain size have been grown on carbon substrates. However, the low expansion coefficient ($10 \times 10^{-6°}$ C.$^{-1}$) of isotropic graphite compared to $Zn_3P_2$ results in cracking of the film during cooling. Thin films of carbon have been deposited on mica by arc and electron beam evaporation, but above ~0.1 μm thickness, the high intrinsic stress makes the film mechanically unstable. Below 0.1 μm, films are frequently stable, but the sheet resistance is too high to yield workable devices.

This invention also relates to a new multilayer substrate which overcomes the problems attendant with the use of carbon, while benefiting from its advantages.

Conceptually, the ideal substrate for the deposition of a reactive compound or elemental semiconductor may be viewed as a multilayer structure consisting of: a thick, mechanically rigid, bottom layer which matches the expansion coefficient of the semiconductor; a conducting metal film to give a low series resistance contact; and a barrier layer to prevent reaction between the semiconductor and the underlying components.

FIG. 3 illustrates a substrate 10 in accordance with this invention which is of the multilayer type specifically designed to meet the above criteria. Substrate 10 includes a support layer 12 which is preferably made of mica or iron-silicon alloy sheet, although other materials such as mica glass, magnesium oxide, iron, copper or aluminum may be used. Substrate 10 also includes a layer 14 which is selected for its conductivity characteristics. In a preferred form of this invention, layer 14 is made from iron which is deposited on support 12 by vacuum evaporation such as thermal evaporation or electron beam evaporation. If desired, the iron may be used to replace the mica and layers 12 and 14 may thereby be a single layer. Where separate layers are used, the layer 14 preferably has a thickness of at least 500 Å to 1 μm although the layer should not be too thick. Substrate 10 also includes a layer 16 which functions as a diffusion barrier and adherent means as later described. Layer 16 is preferably made by depositing carbon on layer 14 by any suitable means such as electron beam or arc vaporization in a vacuum or plasma decomposition of a hydrocarbon. The thickness of the carbon layer may be 500-1000 Å. When the carbon layers are too thick, high intrinsic stress of carbon film causes microcracks to develop which allow iron to diffuse into the $Zn_3P_2$. It was also found that prompt deposition of carbon on the iron films is advantageous. All of the layers in substrate 10 are preferably formed or deposited at room temperature. Layer 16 is preferably of a thickness of 500-2000 Å, with 1000 Å being preferred. Support layer 12 is much thicker than layers 14 and 16, and may be as great as 250 μm.

Ordinarily, simply depositing a carbon layer on iron would not be sufficient to cause the carbon to remain secured to the iron. The present invention, however, includes the recognition that the substrate is used in connection with a semiconductor which is grown or deposited at very high temperatures. As previously discussed, the preferred semiconductor is zinc phosphide, but other semiconductors such as gallium arsenide, indium phosphide or silicon may also be used. FIG. 4 illustrates the formation of the semiconductor layer 18 which is grown at high temperatures in order to obtain the desired structure or preferred grain size of, for example, the zinc phosphide film. Under these high temperature conditions, a carbon-iron reaction takes place, thereby resulting in an intermediate region 20 of iron carbide which is believed to be produced. This intermediate region functions to effectively adhere carbon layer 16 to iron layer 14. The resultant substrate 10 thus provides a non-reactive or inert ohmic contact which withstands the high temperature necessary for semiconductor film growth and the substrate is mechanically stable to function as a support while having all of the characteristics necessary for ohmic contact.

If desired, the substrate 10 including the iron carbide region 20 may be formed by applying a separate high temperature heating to the substrate before the semiconductor is grown thereon, rather than utilizing the high temperature from the semiconductor growing step. Such preliminary high temperature heating would be done in an inert or non-oxidizing atmosphere.

Various materials may be used for practicing the concepts of this invention. Layer 16 is selected of a material which acts as a barrier in that it prevents a chemical reaction between the semiconductor 18 and the high conductivity layer 14. Layer 16, as previously noted, has the added function of comprising adherent means by reacting under high temperature with layer 14. Layer 14 is selected for having low resistivity and high conductivity and metals such as iron or silver may be used. Layer 14 also makes intimate contact with support layer 12 which in turn is selected to provide stability to the composite substrate and acts as the thermal expansion match component of the substrate 10 by having the same or slightly greater expansion coefficient as that of semiconductor 18. Support layer 12 may be a metal, a semiconductor or an insulator.

In an example of the practice of this invention, multiple layer, thin film substrates have been prepared consisting of a thin film of arc or electron beam deposited carbon 200–1000 Å thick deposited onto a film of either iron or silver of the same thickness. The iron or silver film, in turn, was previously deposited on mica, which has the same expansion coefficient as $Zn_3P_2$ and provides the mechanical support.

Films of $Zn_3P_3$ with grain size 3–10 μm thick have been grown on such substrates by close-spaced-transport. At a substrate temperature of 575° C. a reaction between carbon and iron films occurs within the time scale of the film growth, i.e., 10 minutes.

FIG. 5 illustrates schematically the steps in making the devices of FIGS. 1 and 2, which may also include the improved substrate illustrated by FIGS. 3 and 4. Referring to FIG. 5, the first step is the preparation of the substrate in accordance with this invention. Preparation of the multilayer substrate would be in accordance with the techniques described in detail with reference to FIGS. 3 and 4, and is accomplished by using conventional vacuum deposition involving sequential deposition of iron followed by deposition of carbon over iron. The method of electron beam evaporation onto an unheated substrate has been found to be straightforward and effective in carrying out this aspect of the invention.

Deposition of the p-type $Zn_3P_2$ layer 19 [FIG. 1] is accomplished by the well known method of close-spaced-transport. Preferably the source to substrate distance is 0.1 cm, the source temperature being 675° C. and the substrate temperature being 575° C. Under these conditions, the $Zn_3P_2$ layer grows at an average rate of 0.75 μm/min. In order to further improve the yield of p-type $Zn_3P_2$ having the desired resistivity, $Zn_3P_2$ may be doped p-type by incorporating Ag metal as a dopant. Other p-type dopants which might prove suitable are Cu, Au and other univalent substitutional cations.

The next step in the practice of this invention is forming the n-type conductivity region on top of semiconductor layer 18. For example, a layer of magnesium is applied to the semiconductor. Upon heating at a low temperature, a small fraction of the magnesium or other dopants diffuse into layer 18 to create the n-type conductivity. A characteristic of this aspect of the invention is that the doping takes place at low temperature. By low temperature is meant temperatures of 300° C. or less, with the preferred range being 50°–150° C. It has been found, for example, that effective doping can be accomplished by evaporating magnesium using d.c. sputtering or thermal or electron beam methods in a vacuum, with the heating being in air at 100° C. for a sufficient time to develop the electrical junction 22 [FIG. 1]. During the heating the current-voltage characteristic can be measured to ascertain when a proper electrical junction is developed. Such low temperatures are lower than commonly practiced in the semiconductor art.

In order to make the device of FIG. 1 n-type, layer 24 is formed by depositing a continuous layer of magnesium by d.c. sputtering to a thickness greater than 100 Å, the maximum thickness being limited by considerations of economy in manufacture. Since the dopant layer will be removed, its thickness is not critical. Prior to depositing the dopant layer, the surface may be cleaned and made smooth by a chemical polishing treatment by, for example, a solution of 1% bromine in methanol. Following a low temperature heating to form an n-type region in accordance with this invention, the remaining magnesium dopant is removed by chemical means such as a solution consisting of hydrogen peroxide and ethylenediamine tetra-acetic acid in water.

Although it is preferable to dope the semiconductor 18 by evaporating magnesium thereon at low temperature, the invention may also be practiced using ion implantation techniques. For example, a beam of magnesium ions may be produced and injected into the semiconductor layer which would permit the use of higher concentration of magnesium. In conventional ion implantation techniques, the implantation step is ordinarily followed by a high temperature annealing. With the present invention, however, no annealing would be used or any such annealing would be at low temperatures such as below 300° C.

The device of FIG. 1 is completed by application of the transparent contact metallization and antireflection layer. Transparent contact metallization can be accomplished by any of several known methods, including vacuum deposition through an aperture mask, vacuum or electrolytic deposition in conjunction with photolithographic pattern formation and etching or printing.

In the practice of the aspect of the invention illustrated in FIG. 2, opaque contact 10 and p-type region 18 are formed by the methods described above. Several alternatives exist for formation of the n-type region 24 depending on the choice of window layer 32. When window layer 32 is a thin transparent metal film in accordance with this invention, a thin film of magnesium 50–100 Å thick is deposited on the cleaned and chemically polished surface of layer 18 by d.c. sputtering techniques. A heat treatment is subsequently carried out in accordance with this invention to form n-type region 24 and homojunction 22. The remaining metal layer serves as window layer 32 and transparent conductor metallization 36 is applied by known means.

When window layer 32 is an oxide semiconductor such as indium-tin-oxide, for example, the n-type region 24 is formed according to the aspects of the invention described in relation to the device of FIG. 1.

For example, the dopant is deposited on layer 18 by d.c. sputtering. A low temperature heat treatment causes n-type region 24 to form. The remaining dopant layer is chemically removed and replaced with a transparent conductor, window layer 32 such as indium-tin-oxide, tin oxide or zinc oxide.

Following the formation of the n-type region 24 and the homojunction 22, the oxide semiconductor in accordance with this invention is deposited by known means such as d.c. or RF sputtering. Deposition of the contact metallization 26 is known by means such as vacuum deposition, electrolytic deposition or printing.

The occurrence of n-type conductivity in $Zn_3P_2$ and the formation of homojunction devices means that much higher open circuit voltages are possible compared to that obtained with ordinary metal-semiconductor diodes. Based on experimental measurements of $Zn_3P_2$ p/n junctions, conversion efficiencies as high as ~18.5% are expected to be achieved in properly fabricated p/n junction devices.

Although the invention has been particularly described with respect to thin film devices, the concepts may be practiced with other devices such as thick polycrystalline or single crystal devices.

What is claimed is:

1. In a photovoltaic device having an ohmic back contact and a transparent electrical contact with at least one semiconductor layer therebetween of a material of the type formed by high temperature growth, the improvement being said device is a homojunction with said semiconductor layer having one region of p-type conductivity and an adjacent region of n-type conductivity with the electrical junction therebetween, said semiconductor layer being made of a material from the class of isostructural compounds comprised of elements selected from Groups IIB and VA of the Periodic Table, and said n-type conductivity region of said semiconductor layer being extrinsically doped with an element selected from groups IA and IIA of the Periodic Table.

2. In the device of claim 1 wherein said transparent electrical contact is made from a material capable of acting as said extrinsic n-type conductivity doping agent.

3. In the device of claim 2 wherein said semiconductor is made from zinc phosphide, and said transparent electrical contact material is magnesium.

4. In the device of claim 1 wherein said transparent electrical contact is a metallization pattern having substantial open spaces.

5. In the device of claim 1 wherein said transparent electrical contact is a metallization pattern having substantial open areas, and a continuous window layer is disposed between said metallization pattern and said n-type conductivity region.

6. In the device of claim 5 wherein said window layer is a thin metal film made from a material capable of acting as said extrinsic n-type conductivity doping agent.

7. In the device of claim 1 wherein said ohmic back contact is a multilayer substrate capable of withstanding the high temperature for forming said semiconductor layer, said substrate layers including a layer remote from said semiconductor layer comprising a support on which all of the other layers of said device are formed, said substrate layers including a layer having an expansion coefficient equal to or slightly greater than the expansion coefficient of said semiconductor layer, said substrate layers including a metal layer of high conductivity, and said substrate layers including a barrier layer adjacent said semiconductor layer which comprises a diffusion barrier and further comprises adherent means for causing said barrier layer to adhere to said metal layer.

8. In the device of claim 7 wherein said barrier layer is a different layer than said metal layer, and an intermediate layer being between said barrier layer and said metal layer formed by the reaction of said barrier and metal layers.

* * * * *